United States Patent
Bellala et al.

(10) Patent No.: US 9,537,309 B2
(45) Date of Patent: Jan. 3, 2017

(54) POWER SUPPLY CIRCUIT, POWER SUPPLY SYSTEM, AND ELECTRIC STORAGE DEVICE

(71) Applicant: Sony Corporation, Tokyo (JP)

(72) Inventors: Raghunath Bellala, Fukushima (JP); Noritoshi Imamura, Miyagi (JP)

(73) Assignee: Sony Corporation, Tokyo (JP)

( * ) Notice: Subject to any disclaimer, the term of this patent is extended or adjusted under 35 U.S.C. 154(b) by 64 days.

(21) Appl. No.: 14/242,327

(22) Filed: Apr. 1, 2014

(65) Prior Publication Data

US 2014/0306672 A1    Oct. 16, 2014

(30) Foreign Application Priority Data

Apr. 11, 2013 (JP) .................. 2013-082659

(51) Int. Cl.
| | | |
|---|---|---|
| G05F 1/56 | (2006.01) | |
| H02J 1/00 | (2006.01) | |
| H03K 17/082 | (2006.01) | |
| H03K 17/10 | (2006.01) | |

(52) U.S. Cl.
CPC . *H02J 1/00* (2013.01); *G05F 1/56* (2013.01); *H03K 17/0828* (2013.01); *H03K 17/107* (2013.01)

(58) Field of Classification Search
CPC ............ H02M 3/1588; H02M 2001/007; G05F 1/571
USPC .......... 323/28–289; 320/118, 119, 125, 139; 307/37, 100, 112, 116, 125; 363/16–20, 363/65, 66, 67
See application file for complete search history.

(56) References Cited

U.S. PATENT DOCUMENTS

| | | | | |
|---|---|---|---|---|
| 5,006,782 A | * | 4/1991 | Pelly .................. | H02M 3/158 323/225 |
| 5,036,269 A | * | 7/1991 | Murari ................ | G05F 1/571 323/266 |
| 5,483,433 A | * | 1/1996 | Yang .................. | H02M 7/483 307/37 |
| 6,525,514 B1 | * | 2/2003 | Balakrishnan .... | H02M 3/33507 323/277 |
| 6,781,353 B2 | * | 8/2004 | Rozsypal ............ | H02M 3/1582 323/224 |
| 6,798,177 B1 | * | 9/2004 | Liu ..................... | H02M 3/1582 323/222 |

(Continued)

FOREIGN PATENT DOCUMENTS

| | | |
|---|---|---|
| DE | 19739008 | 4/1999 |
| JP | 2003-259632 | 9/2003 |

(Continued)

OTHER PUBLICATIONS

Extended European Search Report issued in connection with European Patent Application No. 14000883.0, dated Jun. 19, 2015. (9 pages).

*Primary Examiner* — Rajnikant Patel
(74) *Attorney, Agent, or Firm* — K&L Gates LLP (57) ABSTRACT

There is provided a power supply circuit including a first series regulator including a first semiconductor element and a first constant voltage source, and a second series regulator including a second semiconductor element and a second constant voltage source, wherein the first series regulator and the second series regulator are cascaded and an input voltage to the first series regulator is a high voltage equal to or greater than 500 V.

11 Claims, 5 Drawing Sheets

(56) References Cited

U.S. PATENT DOCUMENTS

| | | | |
|---|---|---|---|
| 7,812,579 B2 * | 10/2010 | Williams | H02M 3/07 323/222 |
| 8,270,188 B1 * | 9/2012 | Kim | H02M 1/44 307/13 |
| 2009/0225478 A1 | 9/2009 | Kido et al. | |
| 2013/0099747 A1 * | 4/2013 | Baba | H02J 7/0019 320/118 |

FOREIGN PATENT DOCUMENTS

| | | | |
|---|---|---|---|
| JP | 2009-211210 | * | 9/2009 |
| JP | 2013-003714 | | 1/2013 |

* cited by examiner

POWER SUPPLY CIRCUIT, POWER SUPPLY SYSTEM, AND ELECTRIC STORAGE DEVICE

CROSS REFERENCES TO RELATED APPLICATIONS

The present application claims priority to Japanese Priority Patent Application JP 2013-082659 filed in the Japan Patent Office on Apr. 11, 2013, the entire content of which is hereby incorporated by reference.

BACKGROUND

The present disclosure relates to a power supply circuit, a power supply system, and an electric storage device suitable for forming a low voltage from a high voltage.

There are known series regulators in which a voltage control semiconductor element is connected in series to a load, a constant voltage is supplied to the semiconductor element by a constant voltage source, and a voltage to be applied to the load is constantly maintained (for example, see JP 2003-259632A). The series regulators can apply a constant voltage, for example, even when a load varies.

SUMMARY

In the series regulator disclosed in JP 2003-259632A, there is a concern that an element may break down when a voltage difference between an input voltage and an output voltage is very large. For example, in the case of an electric storage system using a lithium ion secondary cell, for example, it is necessary to form a power supply voltage of a control circuit of a system, such as 12 V, from a high voltage of hundreds of V or more. Such a large voltage difference may cause breakdown of an element in the series regulator according to the related art.

It is desirable to provide a power supply circuit, a power supply system, and an electric storage device capable of forming power of a sufficiently low voltage from a high voltage.

According to an embodiment of the present disclosure, there is provided a power supply circuit in which a first series regulator including a first semiconductor element and a first constant voltage source and a second series regulator including a second semiconductor element and a second constant voltage source are cascaded and in which an input voltage to the first series regulator is a high voltage equal to or greater than 500 V.

According to an embodiment of the present disclosure, since two series regulators are cascaded, it is possible to form an output voltage which is a stable low voltage from an input voltage which is a high voltage.

Additional features and advantages are described herein, and will be apparent from the following Detailed Description and the figures.

DETAILED DESCRIPTION

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Embodiments to be described below are specific examples suitable for the present disclosure and include various technically preferred limitations. However, in the following description, the scope of the present disclosure is not limited to such embodiments as long as no particular description is made to limit the present disclosure.

Note that the following description will be made in the following order.

<1. First embodiment>
<2. Second embodiment>
<3. Application examples>
<4. Modification examples>
<1. First Embodiment>
"Example of Electric Storage System"

Figure 1:
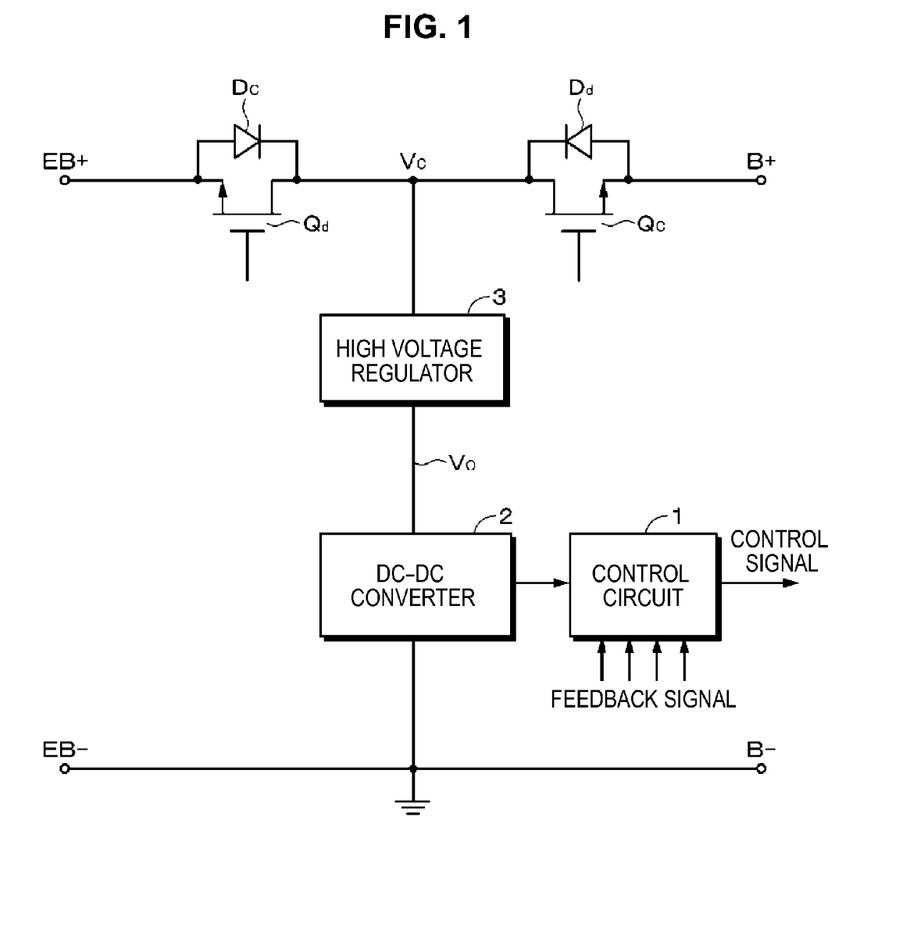
FIG. 1 is a block diagram used to describe an electric storage system to which an embodiment of the present disclosure is applicable.

As illustrated in FIG. 1, in an electric storage system, a control circuit 1 is installed to control power. The control circuit 1 includes a microcomputer. The control circuit 1 performs management for charging management, discharging management, deterioration suppression, and the like. To perform the management, information regarding voltage, current, temperature, and the like from an electric storage element such as a battery cell is supplied as feedback signals and various control signals are output. A power supply voltage is supplied from a DC-DC converter 2 to the control circuit 1.

Although not illustrated, electric storage devices are connected to terminals B+ and B− of the electric storage system. When a plurality of electric storage elements such as battery cells are used to generate a large output, the electric storage device includes a plurality of modules. Although not illustrated, external power feeding devices or loads are connected to terminals EB+ and EB− of the electric storage system. A charging control switch Qc and a discharging control switch Qd are connected in series between the terminals B+ and EB+ on the positive electrode side.

The charging control switch Qc is turned on when the electric storage device is charged. The discharging control switch Qd is turned on when the electric storage device is discharged. A diode Dd in the forward direction of a discharging current is connected in parallel to the charging control switch Qc and a diode Dc in the forward direction of a charging current is connected in parallel to the discharging control switch Qd.

A voltage $V_c$ taken out from a connection point of the charging control switch Qc and the discharging control switch Qd is supplied to a high voltage regulator 3. In the high voltage regulator 3, a high voltage of the connection point is input and a voltage $V_o$ to the DC-DC converter 2 is output. The DC-DC converter 2 forms operational power of the control circuit 1. The input high voltage is a voltage having a variation of +500 V or more and an operational power supply voltage of the control circuit 1 is, for example, +12 V.

In the high voltage regulator 3, as will be described below, two regulators are cascaded. For example, the input voltage $V_c$ to the high voltage regulator 3 is about 800 V, a stable voltage of about 600 V is formed from 800 V by the regulator on the initial stage, and the output voltage $V_o$ of about 400 V is formed from the voltage of about 600 V by the regulator on the rear stage. The power source of the control circuit 1 has, for example, +12 V, which is formed from the output voltage $V_o$ by the DC-DC converter 2.

"High Voltage Regulator"

Figure 2:
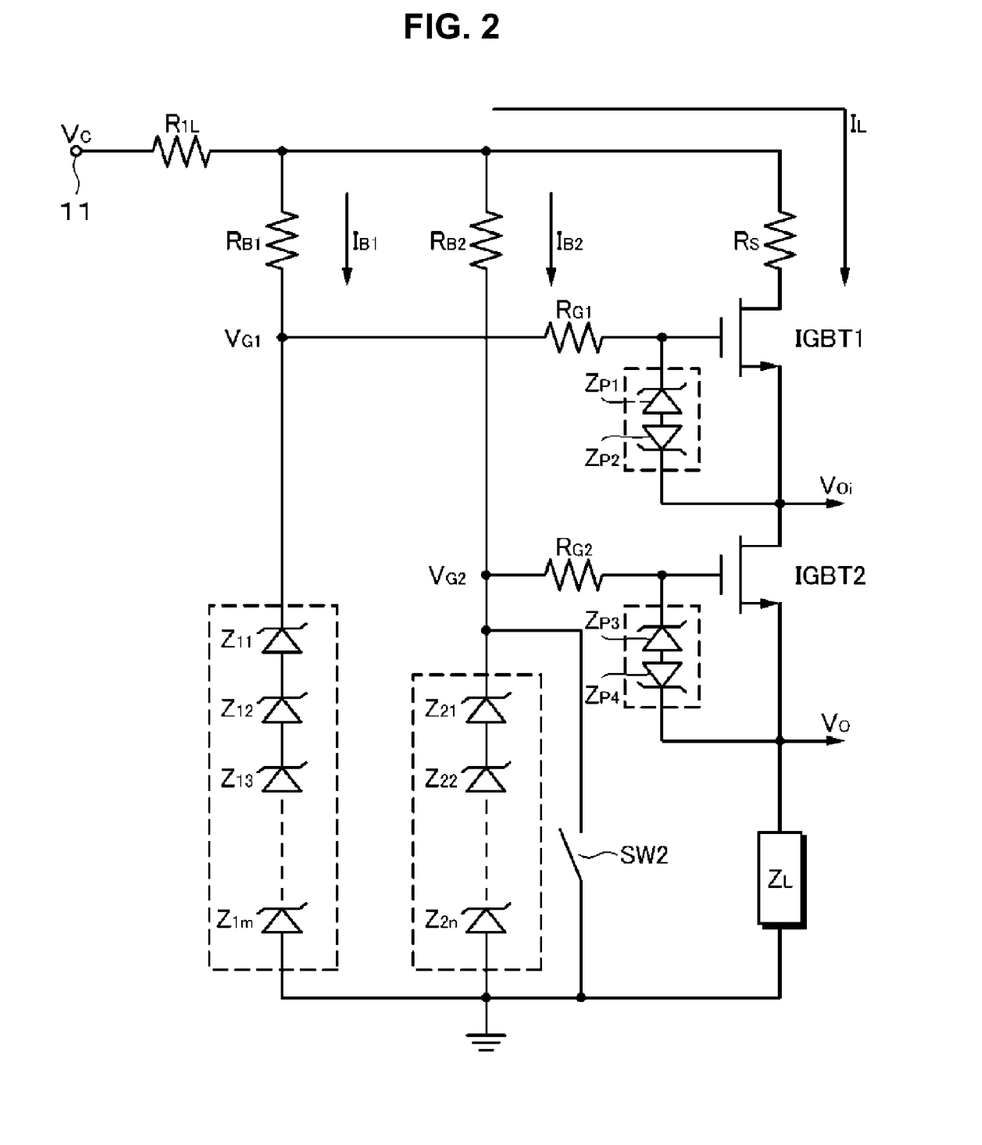
FIG. 2 is a diagram illustrating connection according to a first embodiment of the present disclosure.

An embodiment of the present disclosure is applied to the high voltage regulator 3. FIG. 2 is a diagram illustrating connection in the high voltage regulator according to a first embodiment of the present disclosure. An input terminal 11 to which the input voltage $V_c$ is supplied is connected to a collector of a first semiconductor element, e.g., an insulated gate bipolar transistor (IGBT: a bipolar transistor in which an MOSFET is combined with a gate unit) 1 via a resistor $R_{1L}$ and a resistor Rs. The IGBT includes a collector serving as an input electrode, an emitter serving as an output electrode, and a gate serving as a control electrode.

The input voltage Vc is a varying direct-current voltage. The resistor $R_{1L}$ and the resistor Rs are connected to limit an input rush current. A fuse may be used instead of the resistor Rs. An embodiment of the present disclosure is suitable for forming a power supply voltage of the control circuit from the input voltage $V_c$ which is a relatively high voltage, e.g., +500 V or more.

A resistor $R_{B1}$ and a series circuit of a plurality (m) of zener diodes $Z_{11}$ to $Z_{1m}$ are installed between a ground potential and the connection point of the resistor $R_{1L}$ and the resistor Rs. The series circuit of the zener diodes $Z_{11}$ to $Z_{1m}$ is a first constant voltage source. The resistor $R_{B1}$ is a bias resistor for the zener diodes $Z_{11}$ to $Z_{1m}$. A voltage $V_{G1}$ of the connection point of the resistor $R_{B1}$ and the series circuit of the zener diodes $Z_{11}$ to $Z_{1m}$ is supplied to the gate of the IGBT 1 via the resistor $R_{G1}$. The resistor $R_{G1}$ is connected to prevent an excessive gate current from flowing due to a charge accumulated in parasitic capacitance of the IGBT 1 when the IGBT 1 is turned off.

An output voltage $V_{oi}$ is taken out from the emitter of the IGBT 1, as necessary. The emitter of the IGBT 1 is connected to a collector of an IGBT 2 that forms a second series regulator. Between the gate and the emitter of the IGBT 1, two zener diodes $Z_{P1}$ and $Z_{P2}$ are inserted in series in the backward direction. The zener diodes $Z_{P1}$ and $Z_{P2}$ are installed to prevent an excessive voltage from being applied between the gate and the emitter of the IGBT 1.

As in the first series regulator, the second series regulator includes the IGBT 2 and a constant voltage source (which generates a voltage $V_{G2}$) in which n zener diodes $Z_{21}$ to $Z_{2n}$ are connected in series. The first and second series regulators are cascaded. A load $Z_L$ is connected to the second series regulator. The output voltage $V_o$ is applied to the load $Z_L$. The load $Z_L$ corresponds to, for example, a circuit of the DC-DC converter 2 in FIG. 1. As in the first series regulator, the second series regulator includes a bias resistor $R_{B2}$, a resistor $R_{G2}$ for suppression of a gate current, and zener diodes $Z_{P3}$ and $Z_{P4}$ for suppression of a voltage between a gate and an emitter in association with the IGBT 2.

Further, a switch SW2 is installed to short-circuit the series circuit of the zener diodes $Z_{21}$ to $Z_{2n}$ included in the constant voltage source of the second series regulator. When a control circuit (not illustrated) is installed and the control circuit detects a risk that the input voltage $V_c$ may increase considerably and the IGBT 1 on the initial stage may break down and short-circuit, a control signal for turning on the switch SW2 is generated. When the switch SW2 is turned on, the IGBT 2 is turned off, thereby preventing an excessive output voltage from being generated.

An operation of the above-described high voltage regulator will be described.

Reference signs of voltages and currents have the following values:

$V_c$: a variable input voltage,
$V_{GE1}$: a voltage between the gate and the emitter of the IGBT 1,
$V_{GE2}$: a voltage between the gate and the emitter of the IGBT 2,
$I_{B1}$: a current flowing in the zener diodes $Z_{11}$ to $Z_{1m}$,
$I_{B2}$: a current flowing in the zener diodes $Z_{21}$ to $Z_{2m}$,
$I_L$: a load current,
$V_{G1}$: a gate voltage of the IGBT 1,
$V_{G2}$: a gate voltage of the IGBT 2,
$V_{Z11}$ to $V_{Z1m}$: zener voltages of zener diodes $Z_{11}$ to $Z_{1m}$,
$V_{Z21}$ to $V_{Z2m}$: zener voltages of zener diodes $Z_{21}$ to $Z_{2m}$,
$V_o$: a stabilized output voltage,
$P_i$: input power, and
$P_o$: output power.

An input voltage is stabilized by the series regulator on the initial stage and the output voltage $V_{oi}$ is generated. Since the gate voltage of the IGBT 1 is formed by the series circuit of the zener diodes $Z_{11}$ to $Z_{1m}$, the following relation is established:

$$V_{oi} = V_{G1} - V_{GE1} \qquad (1).$$

A stabilized output voltage $V_o$ is formed as follows by the second series regulator:

$$V_o = V_{G2} - V_{GE2} \qquad (2), \text{where}$$

$$V_{G1} = V_{Z11} + V_{Z12} + \ldots + V_{Z1m} \qquad (3), \text{and}$$

$$V_{G2} = V_{Z21} + V_{Z22} + \ldots + V_{Z2m} \qquad (4).$$

$$P_i = V_c \times (I_{B1} + I_{B2} + I_L) \qquad (5), \text{and}$$

$$P_o = V_o \times I_L \qquad (6).$$

Examples of specific voltage values are as follows.

"$V_{G1}$=610 V" is set and the stabilized output voltage $V_{oi}$ of the series regulator on the initial stage is set as (610−5.5=605.5 V).

"$V_{G2}$=376 V" is set and the stabilized output voltage $V_{oi}$ of the series regulator on the initial stage is set as (376−5.5=370.5 V).

Accordingly, a voltage drop of almost about 200 V occurs in each series regulator.

In the above-described first embodiment of the present disclosure, the following operational effects can be obtained.

When a load is light, a loss can be reduced.

Complicated switching control is not necessary and a circuit configuration is simple.

Protection can be realized against a dangerous abnormal voltage.

Since the IGBTs are cascaded, a loss of each IGBT can be reduced.

<2. Second Embodiment>

Figure 3:
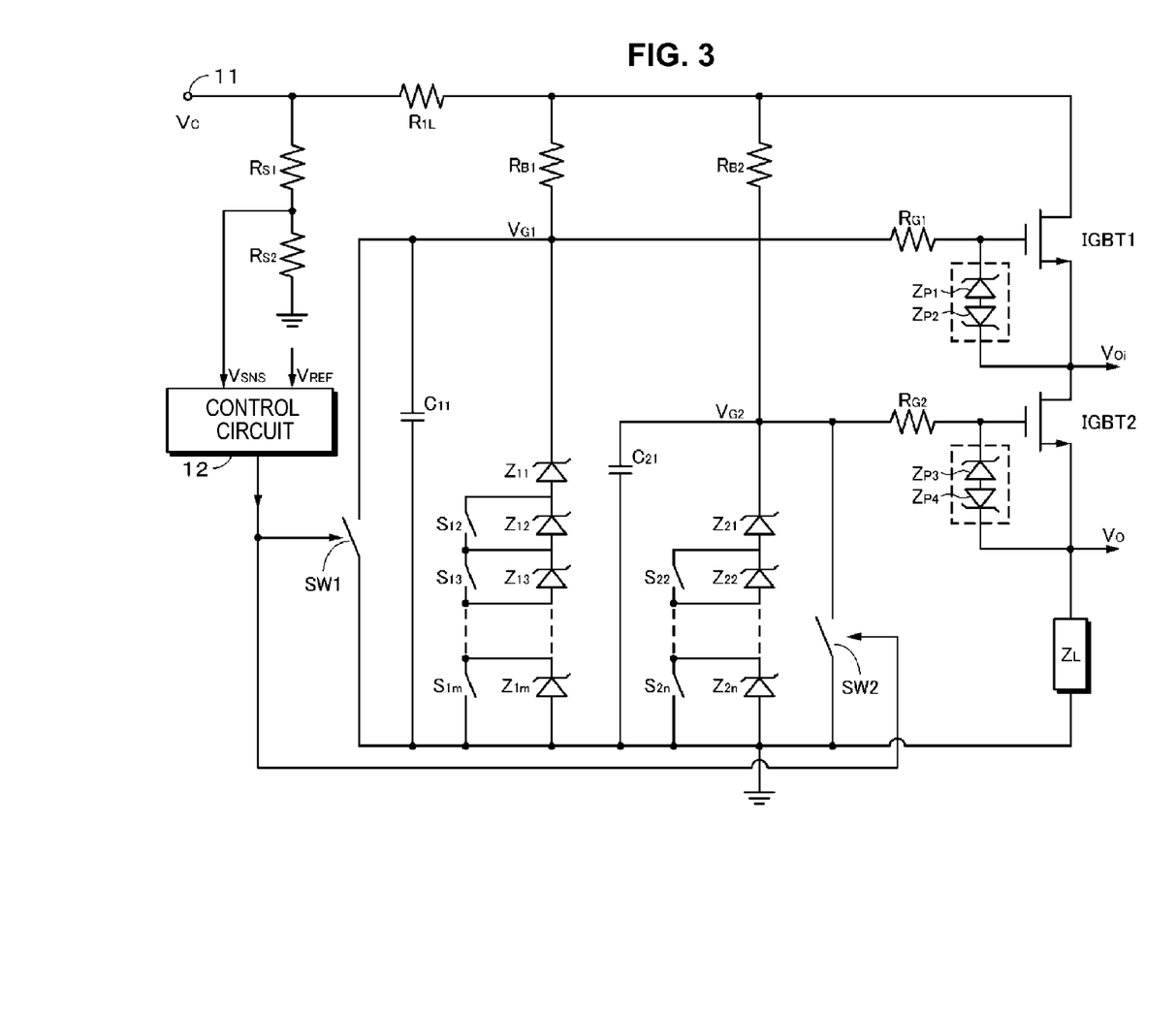
FIG. 3 is a diagram illustrating connection according to a second embodiment of the present disclosure.

A second embodiment of the present disclosure will be described with reference to FIG. 3. Differences from the above-described first embodiment will be mainly described.

Added circuits and circuit elements are as follows.

A control circuit 12 is installed to detect that the input voltage $V_c$ abnormally increases.

A series circuit of detection resistors $R_{s1}$ and $R_{s2}$ is inserted between an input terminal 11 and a ground, and a detection voltage $V_{SNS}$ is taken out in a connection point of these resistors so that the detection voltage $V_{SNS}$ is supplied to the control circuit 12.

A reference voltage $V_{REF}$ is supplied to the control circuit 12, and the reference voltage $V_{REF}$ and the detection voltage $V_{SNS}$ are compared in the control circuit 12. When $V_{SNS} > V_{REF}$, the input voltage $V_c$ is determined to be abnormally high, and thus a control signal for turning on a switch is generated. Here, the abnormal input voltage is appropriately set according to a voltage at the time of actual use and the specification of the zener diodes. For example, the abnormal input voltage is assumed to be about twice the actually used voltage. Normally, in the case of 800 V, the switch is turned on with 1.6 kV. Also, although not illustrated, when an output voltage is abnormal rather than the input voltage, a switch SW1 or SW2 may be set to be turned on. An output voltage considered to be abnormal is, for example, an output voltage with a value about twice an assumed output voltage.

The switch SW1 is connected in parallel to the series circuit of the zener diodes $Z_{11}$ to $Z_{1m}$, and the switch SW2 is connected in parallel to the series circuit of the zener diodes $Z_{21}$ to $Z_{2m}$. The switches SW1 and SW2 are controlled by an output of the control circuit 12. When an abnormal input voltage is detected by the control circuit 12, both of the switches SW1 and SW2 are turned on. Accordingly, both of the IGBT 1 and the IGBT 2 are considered to be turned off.

Switches $S_{12}, S_{13}, \ldots$, and $S_{1m}$ are connected in parallel to the zener diodes other than the zener diode $Z_{11}$ among the zener diodes $Z_{11}$ to $Z_{1m}$. Likewise, switches $S_{22}, S_{23}, \ldots$, and $S_{2m}$ are connected in parallel to the zener diodes other than the zener diode $Z_{21}$ among the zener diodes $Z_{21}$ to $Z_{2m}$.

These switches are configured to be individually controlled by control signals generated by a control circuit (not illustrated). That is, a gate voltage $V_{G1}$ of the IGBT 1 and a gate voltage $V_{G2}$ of the IGBT 2 are changed according to connection states of the switches. As understood from Equations (1) and (2), the output voltage $V_{oi}$ is determined by the voltage $V_{G1}$ and the output voltage $V_o$ is determined by the voltage $V_{G2}$. Accordingly, desired output voltages are formed by controlling the switches $S_{12}$ to $S_{1m}$ and the switches $S_{22}$ to $S_{2m}$.

The control on the switches $S_{12}$ to $S_{1m}$ and the switches $S_{22}$ to $S_{2m}$ may be changed in a temporal direction. For example, when feeding of power to the load $Z_L$ starts, the output voltages can be gradually increased (soft start) by gradually increasing the voltage $V_{G1}$ and/or the voltage $V_{G2}$. In contrast, the output voltages may be gradually decreased.

A capacitor $C_{11}$ is connected in parallel to the series circuit of the zener diodes $Z_{11}$ to $Z_{1m}$ and a capacitor $C_{21}$ is connected in parallel to the series circuit of the zener diodes $Z_{21}$ to $Z_{2m}$. The capacitors $C_{11}$ and $C_{21}$ have a function of preventing an excessive current from flowing abruptly in the series circuits of the zener diodes to protect the zener diodes.

In the above-described second embodiment of the present disclosure, the following operational effects can be obtained in addition to the operational effects obtained in the first embodiment:

It is possible to control the output voltages in the temporal direction in which the output voltages participating in the load are gradually increased; and it is possible to prevent an abruptly large current from flowing in the series circuits of the zener diodes to protect the zener diodes.

<3. Application Examples>

Power Storage Device in a House According to an Application Example

Figure 4:
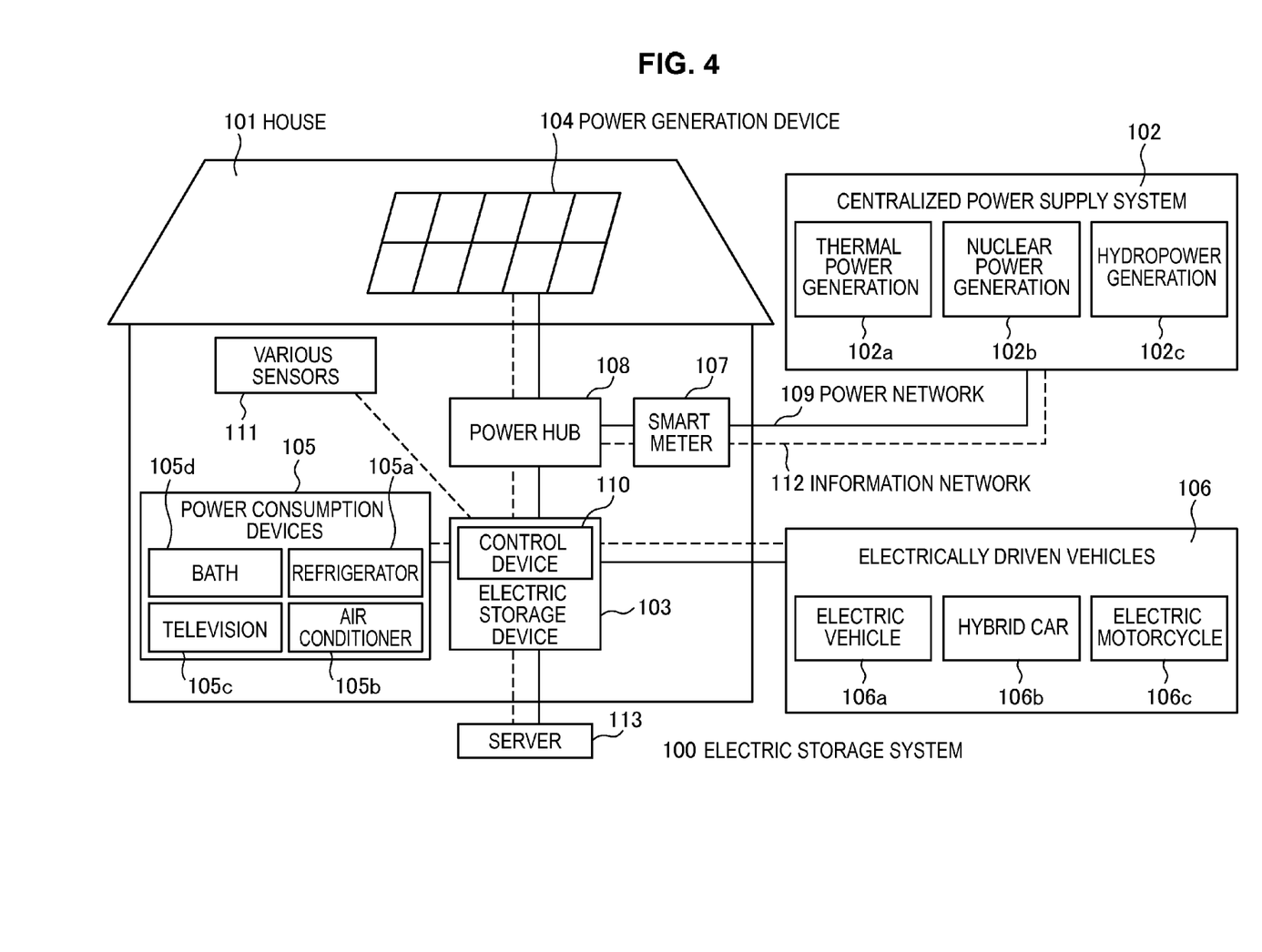
FIG. 4 is a block diagram illustrating an example of an application example of the present disclosure.

An example in which an embodiment of the present disclosure is applied to a power storage device for a house will be described with reference to FIG. 4. For example, in a power storage device 100 for a house 101, power is supplied to an electric storage device 103 via a power network 109, an information network 112, a smart meter 107, a power hub 108, and the like from a centralized power supply system 102 such as thermal power generation 102*a*, nuclear power generation 102*b*, or hydropower generation 102*c*. In addition, power is supplied from an independent power supply such as an in-house power generation device 104 to the electric storage device 103. The power supplied to the electric storage device 103 is stored. Power used in the house 101 is fed using the electric storage device 103. The same power storage device can be used not only in the house 101 but also in other buildings.

The in-house power generation device 104, power consumption devices 105, the electric storage device 103, a control device 110 controlling each device, the smart meter 107, and sensors 111 acquiring various kinds of information are installed in the house 101. The respective devices are connected via the power network 109 and the information network 112. Power generated using a solar cell, a fuel cell, or the like as the in-house power generation device 104 is supplied to the power consumption devices 105 and/or the electric storage device 103. The power consumption devices 105 include a refrigerator 105*a*, an air conditioner 105*b*, a television receiver 105*c*, and a bath 105*d*. Further, the power consumption devices 105 include electrically driven vehicles 106. The electrically driven vehicles 106 include an electric vehicle 106*a*, a hybrid car 106*b*, and an electric motorcycle 106*c*.

The electric storage device 103 includes secondary cells or capacitors. For example, the electric storage device 103 includes lithium ion secondary cells. The lithium ion secondary cells may be fixed cells or cells used for the electrically driven vehicles 106. The smart meter 107 has a function of measuring a use amount of commercial power and transmitting the measured use amount to a power company. The power network 109 may be one of direct-current power feed, alternating-current power feed, and contactless power feed or may be a combination of a plurality thereof.

Examples of the various sensors 111 include a motion detection sensor, an illuminance sensor, an object detection sensor, a power consumption sensor, a vibration sensor, a contact sensor, a temperature sensor, and an infrared sensor. Information acquired by the various sensors 111 is transmitted to the control device 110. Based on the information from the sensors 111, weather states, human states, or the like are comprehended so that energy consumption can be minimized by automatically controlling the power consumption devices 105. Further, the control device 110 can transmit information regarding the house 101 to an external power company or the like via the Internet.

Processes such as partition of power lines, and direct-current and alternating-current conversion are performed by the power hub 108. Examples of communication schemes of the information network 112 connected to the control device 110 include a method of using a communication interface such as a Universal Asynchronous Receiver-Transmitter (UART) and a method of using a sensor network by a wireless communication standard such as Bluetooth (registered trademark), ZigBee (registered trademark), or Wi-Fi (registered trademark). In the Bluetooth (registered trademark) scheme, multimedia communication is applied and one-to-multi connection communication can be performed. In ZigBee, the physical layer of Institute of Electrical and Electronics Engineers (IEEE) 802.15.4 is used. IEEE 802.15.4 is the name of a short-distance wireless network standard known as a Personal Area Network (PAN) or wireless (W) PAN.

The control device 110 is connected to an external server 113. The server 113 may be managed by any of the house 101, a power company, and a service provider. Examples of information transmitted and received by the server 113 include power consumption information, life pattern information, a power fee, weather information, natural disaster information, and information regarding power trade. Such information may be transmitted and received to and from a power consumption device (for example, a television receiver) in the house or may be transmitted and received to and from a device (for example, a mobile phone) outside the house. Such information may be displayed on a device having a display function, such as a television receiver, a mobile telephone, or a personal digital assistant (PDA).

The control device 110 controlling each unit includes a CPU, a RAM, and a ROM and is received in the electric storage device 103 in this example. The control device 110 is connected to the electric storage device 103, the in-house power generation device 104, the power consumption device 105, the various sensors 111, and the server 113 via the information network 112 and has, for example, a function of adjusting a use amount and a generation amount of commercial power. Note that, in addition, the control device 110 may have a function of performing power trade in a power market.

As described above, the power generated not only by the centralized power supply system 102 such as the thermal power generation 102a, the nuclear power generation 102b, or the hydropower generation 102c but also by the in-house power generation device 104 (solar light generation or wind power generation) can be stored in the electric storage device 103. Accordingly, even when power generated by the in-house power generation device 104 varies, control can be performed such that an amount of power transmitted to the outside is allowed to be constant or a necessary amount of power is discharged. For example, a use method of storing power obtained by solar light generation in the electric storage device 103, storing nighttime power for which a fee is cheap at nighttime in the electric storage device 103, and discharging the power stored in the electric storage device 103 at a time at which a fee is expensive during the day can be used.

Also, in this example, the example in which the control device 110 is received in the electric storage device 103 has been described, but the control device 110 may be received in the smart meter 107 or may be configured solely. Further, the power storage device 100 may be used for a plurality of houses in a multiple-dwelling complex or may be used for a plurality of detached houses.

"Power Storage Device in a Vehicle According to an Application Example"

Figure 5:
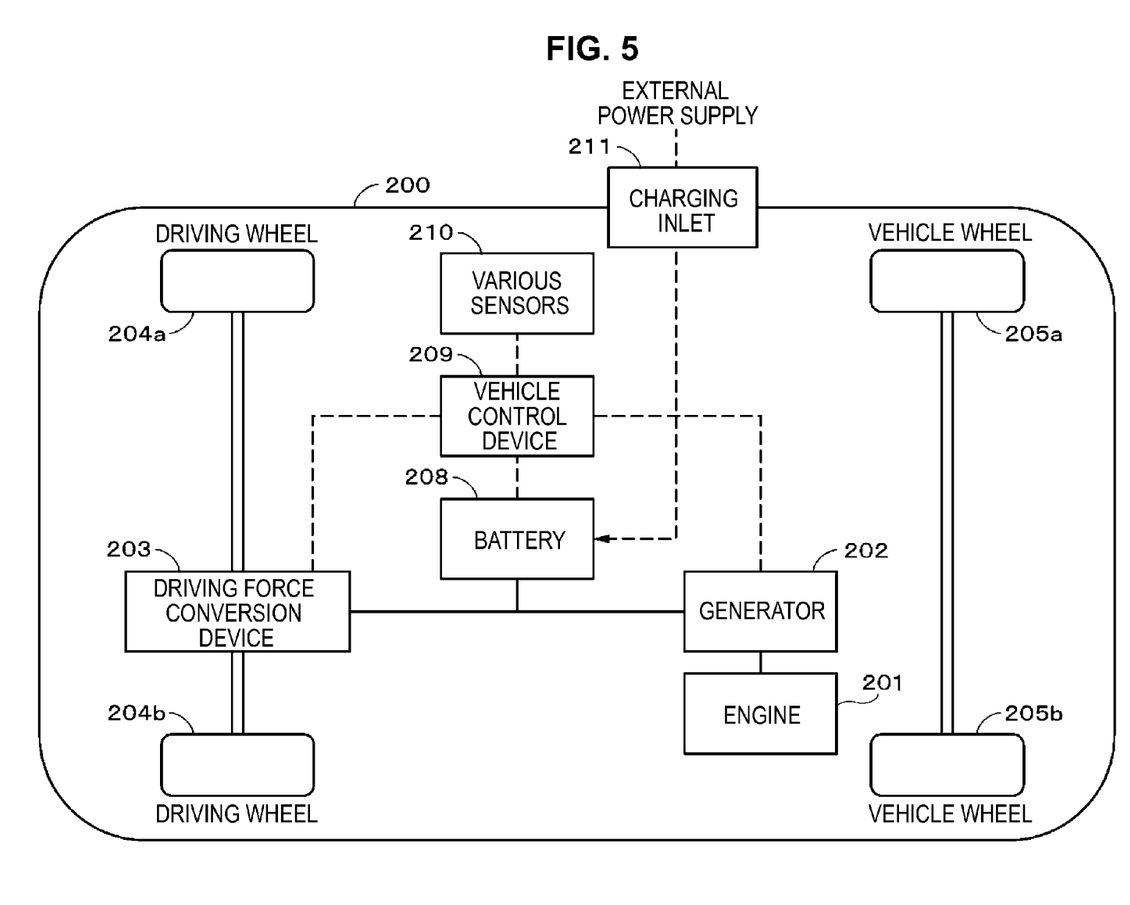
FIG. 5 is a block diagram illustrating another example of the application example of the present disclosure.

An example in which an embodiment of the present disclosure is applied to a power storage device will be described with reference to FIG. 5. FIG. 5 is a diagram schematically illustrating one example of the configuration of a hybrid vehicle adopting a series hybrid system to which an embodiment of the present disclosure is applied. The series hybrid system is a vehicle that moves by an engine and runs by a power driving force conversion device, using power having generated by a generator or power stored in a battery.

An engine 201, a generator 202, a power driving force conversion device 203, a driving wheel 204a, a driving wheel 204b, a vehicle wheel 205a, a vehicle wheel 205b, a battery 208, a vehicle control device 209, various sensors 210, and a charging inlet 211 are mounted on a hybrid vehicle 200.

The hybrid vehicle 200 runs using the power driving force conversion device 203 as a power source. An example of the power driving force conversion device 203 is a motor. The power driving force conversion device 203 operates by power of the battery 208 and a rotational force of the power driving force conversion device 203 is delivered to the driving wheels 204a and 204b. Also, by using direct-current and alternating-current (DC-AC) conversion or reverse (AC-DC) conversion where necessary, the power driving force conversion device 203 can be applied to either an alternating-current motor or a direct-current motor. The various sensors 210 control the number of rotations of the engine or control opening (throttle opening) of a throttle valve (not illustrated) via the vehicle control device 209. The various sensors 210 include a speed sensor, an acceleration sensor and an engine rotation number sensor.

A rotational force of the engine 201 is delivered to the generator 202 and power generated using the rotational force by the generator 202 can be stored in the battery 208.

When the hybrid vehicle is decelerated by a braking mechanism (not illustrated), a resistant force at the time of the deceleration is added as a rotational force to the power driving force conversion device 203 and regenerative power generated using the rotational force by the power driving force conversion device 203 is stored in the battery 208.

When the battery 208 is connected to an external power supply of the hybrid vehicle, power is supplied from the external power supply using the charging inlet 211 as an input port and can be stored.

Although not illustrated, an information processing device performing information processing regarding vehicle control according to information regarding a secondary cell may be provided. An example of the information processing device includes an information processing device that displays a remaining battery capacity based on information regarding a remaining capacity of the battery.

The series hybrid vehicle that moves by the engine and runs by the motor using the power having generated by the generator or the power stored in the battery has been described above as an example. However, an embodiment of the present disclosure can be effectively applied even to a parallel hybrid vehicle that uses any of the outputs of an engine and a motor as a driving source and appropriately switches and uses three schemes of running only by the engine, running only by the motor, and running by the engine and the motor. Further, an embodiment of the present disclosure can be effectively applied even to a so-called electrically driven vehicle that is driven and runs only by a driving motor without using an engine.

Additionally, the present application may also be configured as below.

(1) A power supply circuit including:
a first series regulator including a first semiconductor element and a first constant voltage source; and
a second series regulator including a second semiconductor element and a second constant voltage source, wherein the first series regulator and the second series regulator are cascaded and an input voltage to the first series regulator is a high voltage equal to or greater than 500 V.

(2) The power supply circuit according to (1),
wherein the first semiconductor element and the second semiconductor element each include an input electrode, an output electrode, and a control electrode, and
wherein the first constant voltage source and the second constant voltage source are connected to the control electrode of the first semiconductor element and the control electrode of the second semiconductor element, respectively.

(3) The power supply circuit according to (1),
wherein a detection unit configured to detect a value of at least one of the input voltage and the output voltage is provided, and
wherein, when the detection unit detects that the value is abnormally greater, at least one of the first constant voltage source and the second constant voltage source is controlled and at least one of the first semiconductor element and the second semiconductor element is turned off.

(4) The power supply circuit according to (1), wherein switches configured to vary voltage values by the first constant voltage source and the second constant voltage source are provided.

(5) The power supply circuit according to (4), wherein the switch changes the voltage value in a temporal direction.

(6) The power supply circuit according to (1), wherein a capacitor is provided in parallel to each of the first constant voltage source and the second constant voltage source.

(7) The power supply circuit according to (6), wherein current limitation elements are connected to the control electrode of the first semiconductor element and the control electrode of the second semiconductor element.

(8) A power supply system including:
an electric storage unit;
a switch element configured to control charging and discharging of the electric storage unit;
a control circuit configured to control the switch element; and
a power supply circuit configured to form operational power of the control circuit from a voltage of the electric storage unit,
wherein the power supply circuit has a configuration according to (1).

(9) An electric storage device including:
the power supply system according to (8),
wherein direct-current power formed from an external power supply system is used as charging power of the electric storage unit, and
wherein output power of the electric storage unit is supplied to an electronic device.

<4. Modification Examples>

The embodiments of the present disclosure have been specifically described above, but the above-described embodiments are not limiting. Various modifications can be made based on the technical spirit and essence of the present disclosure. For example, the configurations, methods, processes, shapes, materials, numerical values, and the like exemplified in the above-described embodiments are merely examples, and configurations, methods, processes, shapes, materials, numerical values, and the like different therefrom may be used as necessary. For example, the values of the voltages and the values of the currents described above are merely examples and other values may be used. Further, when the output voltages are monitored and the output values are abnormally large values, the semiconductor elements may be turned off. Further, elements other than the IGBTs, such as Field Effect Transistors (FETs), may be used as the semiconductor elements. Further, three or more series regulators may be cascaded. Also, the configurations, methods, processes, shapes, materials, numerical values, and the like exemplified in the above-described embodiments can be combined mutually as long as they do not depart from the gist of the present disclosure.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A power supply circuit comprising:
a first series regulator including a first semiconductor element and a first constant voltage source; and
a second series regulator including a second semiconductor element and a second constant voltage source,
wherein the first series regulator and the second series regulator are cascaded and wherein the first series regulator is configured to be input with a high voltage equal to or greater than 500 V.

2. The power supply circuit according to claim 1,
wherein the first semiconductor element and the second semiconductor element each include an input electrode, an output electrode, and a control electrode, and
wherein the first constant voltage source and the second constant voltage source are connected to the control electrode of the first semiconductor element and the control electrode of the second semiconductor element, respectively.

3. The power supply circuit according to claim 1,
wherein a detection unit configured to detect a value of at least one of the input voltage and the output voltage is provided, and
wherein, when the detection unit detects that the value is greater than a reference value, at least one of the first constant voltage source and the second constant voltage source is controlled and at least one of the first semiconductor element and the second semiconductor element is turned off.

4. The power supply circuit according to claim 1, wherein switches configured to vary voltage values by the first constant voltage source and the second constant voltage source are provided.

5. The power supply circuit according to claim 4, wherein the switch is configured to change the voltage value in a temporal direction.

6. The power supply circuit according to claim 1, wherein a capacitor is provided in parallel to each of the first constant voltage source and the second constant voltage source.

7. The power supply circuit according to claim 6, wherein current limitation elements are connected to the control electrode of the first semiconductor element and the control electrode of the second semiconductor element.

8. A power supply system comprising:
an electric storage unit;
a switch element configured to control charging and discharging of the electric storage unit;
a control circuit configured to control the switch element; and a power supply circuit configured to form operational power of the control circuit from a voltage of the electric storage unit, wherein the power supply circuit has a configuration according to claim 1.

9. An electric storage device comprising:

the power supply system according to claim 8, wherein direct-current power formed from an external power supply system is used as charging power of the electric storage unit, and wherein output power of the electric storage unit is supplied to an electronic device.

10. The power supply circuit according to claim 1, wherein the first semiconductor element and the second semiconductor element each includes an insulated gate bipolar transistor.

11. The power supply circuit according to claim 1, wherein the first constant voltage source is separate from the second constant voltage source.

* * * * *